US010427397B2

United States Patent
Ng et al.

(10) Patent No.: US 10,427,397 B2
(45) Date of Patent: Oct. 1, 2019

(54) STRUCTURAL DESIGNS FOR STRETCHABLE, CONFORMAL ELECTRICAL INTERCONNECTS

(71) Applicant: Palo Alto Research Center Incorporated, Palo Alto, CA (US)

(72) Inventors: Tse Nga Ng, San Diego, CA (US); Ping Mei, San Jose, CA (US); Corie Lynn Cobb, Mountain View, CA (US); Steven E. Ready, Los Altos, CA (US); John S. Paschkewitz, San Carlos, CA (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 699 days.

(21) Appl. No.: 15/007,502

(22) Filed: Jan. 27, 2016

(65) Prior Publication Data

US 2017/0215284 A1    Jul. 27, 2017

(51) Int. Cl.
| | |
|---|---|
| *H05K 1/11* | (2006.01) |
| *H05K 3/46* | (2006.01) |
| *H05K 3/12* | (2006.01) |
| *H05K 1/02* | (2006.01) |
| *B33Y 80/00* | (2015.01) |

(52) U.S. Cl.
CPC ............ *B33Y 80/00* (2014.12); *H05K 1/0283* (2013.01); *H05K 2201/10151* (2013.01)

(58) Field of Classification Search
CPC .................................. H05K 1/115; H05K 1/118
See application file for complete search history.

(56) References Cited

U.S. PATENT DOCUMENTS

| | | | |
|---|---|---|---|
| 6,743,982 B2 | 6/2004 | Biegelsen et al. | |
| 8,552,299 B2 | 10/2013 | Rogers et al. | |
| 8,729,524 B2 | 5/2014 | Rogers et al. | |
| 2006/0225003 A1 | 10/2006 | Agogino et al. | |
| 2010/0330338 A1* | 12/2010 | Boyce | B29C 59/02 428/156 |
| 2011/0059291 A1* | 3/2011 | Boyce | C08J 5/00 428/136 |
| 2016/0181504 A1 | 6/2016 | Paschkewitz et al. | |
| 2016/0268352 A1* | 9/2016 | Hong | H01L 27/3218 |
| 2018/0311833 A1* | 11/2018 | Lipton | B25J 15/12 |

OTHER PUBLICATIONS

Bullis, "Expandable Silicon", http://www.technologyreview.com/news/409198/expandable-silicon/, Dec. 14, 2007; 2 pgs.
(Continued)

*Primary Examiner* — Hoa C Nguyen
*Assistant Examiner* — Amol H Patel
(74) *Attorney, Agent, or Firm* — Fay Sharpe LLP

(57) ABSTRACT

Disclosed is a conformable, stretchable and electrical conductive structure, which includes an auxetic structure, and a plurality of electrical conductors. The plurality of electrical conductors being incorporated within the auxetic structure, to form conformable, stretchable electrical interconnects, configured based on a design of the auxetic structure and placement of the electrical conductors incorporated with the auxetic structure.

12 Claims, 8 Drawing Sheets

(56) References Cited

OTHER PUBLICATIONS

Cobb et al., "Case-Based Reasoning for Evolutionary MEMS Design", Journal of Computing and Informaion Science in Engineering, Sep. 2010, vol. 10 / 031005-1, 10 pgs.
Juan Carlos Alvarez Elipe et al., "Comparative Study of Auxetic Geometries by Means of Computer-Aided Design and Engineering", IOP Publishing, Ltd., Smart Materials and Structures, 21 (2012) 105004 (12pp); Published Jul. 2012, 13 pgs.

* cited by examiner

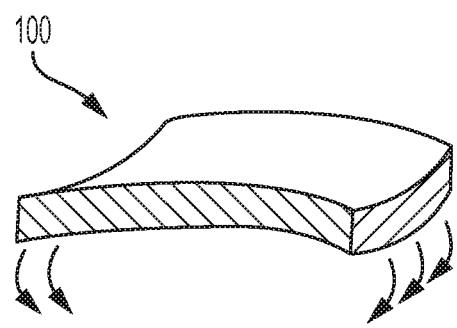
CONVENTIONAL
FIG. 1
AUXETIC

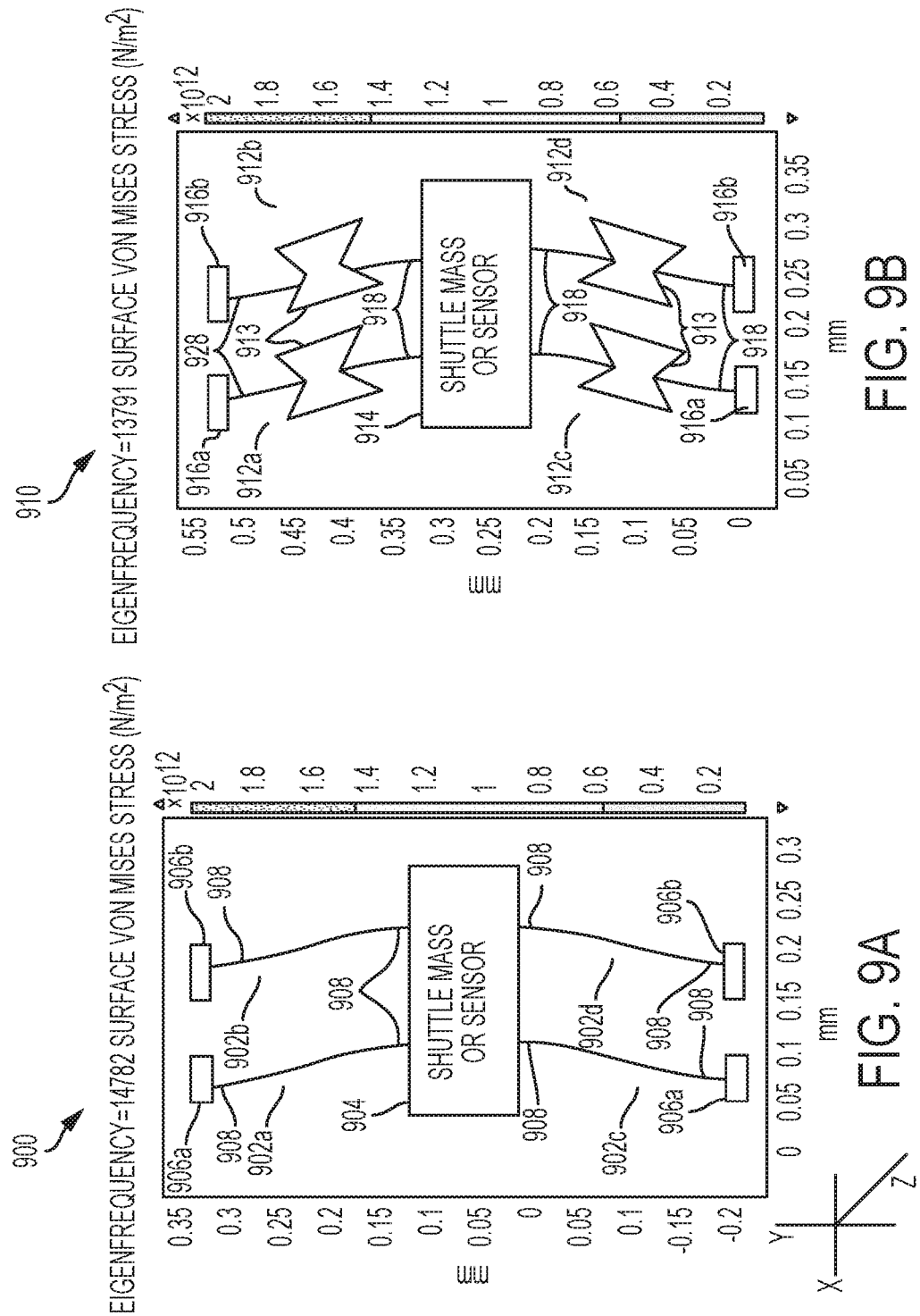

STRUCTURAL DESIGNS FOR STRETCHABLE, CONFORMAL ELECTRICAL INTERCONNECTS

BACKGROUND

The present application is directed to the mechanical and electrical arts, and more particularly to structural designs and arrangements, as well as methods, to form stretchable, conformal electrical interconnects. More particularly, it is noted that as demand for wearable electronics is increasing, there is a need to improve the designs of electrical interconnects to be stretchable and robust under strain due to wearer's motion.

One particular description of such electrical interconnects is described in U.S. patent application Ser. No. 14/581,542, titled "Method For Roll-To-Roll Production Of Flexible, Stretchy Objects With Integrated Thermoelectric Modules, Electronics And Heat Dissipation." Described herein are designs and printing fabrication methods for interconnects that are suitable for a wearable temperature regulation system. Another description is found in U.S. Pat. No. 6,743,982, issued Jun. 1, 2004 to Biegelsen, entitled "Stretchable Interconnects Using Stress Gradient Films Describes A Method And System For A Sensor Array Which Employs Stretchable Interconnects To Connect Contacts Of One Electronic Device To Another Electronic Device."

The present application provides additional methods and designs for improved stretchable, conformal electrical interconnects which may be employed in the field of wearable electronics, as well as for other uses.

INCORPORATION BY REFERENCE

U.S. patent application Ser. No. 14/581,542, filed Dec. 23, 2014 to Paschkewitz et al, titled "Method For Roll-To-Roll Production Of Flexible, Stretchy Objects With Integrated Thermoelectric Modules, Electronics And Heat Dissipation"; and U.S. Pat. No. 6,743,982, issued Jun. 1, 2004 to Biegelsen, entitled "Stretchable Interconnects Using Stress Gradient Films Describes A Method And System For A Sensor Array Which Employs Stretchable Interconnects To Connect Contacts Of One Electronic Device To Another Electronic Device" are each incorporated herein in their entireties.

BRIEF DESCRIPTION

Disclosed is a conformable, stretchable electrical conductive structure, which includes an auxetic structure, and a plurality of electrical conductors. The plurality of electrical conductors being incorporated within the auxetic structure, to form conformable, stretchable electrical interconnects, configured based on a design of the auxetic structure and placement of the electrical conductors incorporated with the auxetic structure.

In an embodiment the conformable, stretchable electrical structure includes having a stretch gradient.

In an embodiment the stretch gradient is defined by unit cell sizes of the auxetic structure and the density of interconnects.

In an embodiment the conformable, stretchable electrical structure further includes anchoring points configured to anchor selected portions of the auxetic structure.

In an embodiment the conformable, stretchable electrical structure includes different anchoring points which adjust a stretch profile.

In an embodiment the conformable, stretchable electrical structure further includes a first set of anchoring points and a second set of anchoring points, wherein the first set of anchoring points provide a first stretch profile of the auxetic structure, and the second set of anchoring points provide a second stretch profile of the auxetic structure different from the first stretch profile of the auxetic structure.

In an embodiment the conformable, stretchable electrical structure is configured with the auxetic structure including multiple auxetic layers having selectively incorporated ones of the plurality of electrical conductors, wherein stretchable electrical interconnects are located with at least some of the multiple auxetic layers, and wherein electrical contact is maintained between the multiple auxetic layers.

In an embodiment the conformable, stretchable electrical structure further includes incorporating at least a sensor and/or an actuator, for built in sensing and/or actuation operations.

In an embodiment the conformable, stretchable electrical structure includes an asymmetric mass-spring-damper structure incorporated with the auxetic structure and the electrical conductors, to form conformal, stretchable electrical interconnects.

In an embodiment the conformable, stretchable electrical structure is defined wherein the asymmetric mass-spring-damper structure is used to provide asymmetry to strain-relief and dampen selected mechanical resonance based on human body movements.

In an embodiment the conformable, stretchable electrical structure includes anchor points having both symmetric and asymmetric designs to adjust stretch profile.

In an embodiment the conformable, stretchable electrical structure is defined wherein the asymmetry is capable of occurring along a single axis or multiple axes.

In an embodiment the conformable, stretchable electrical structure is defined wherein the single axis is the x-axis and the multiple axes are x-, y-, and z-plane.

In an embodiment, a method of forming a conformable, stretchable electrical structure comprises employing a printer arrangement; printing an auxetic structure; printing a plurality of electrical conductors, wherein at least some of the plurality of electrical conductors are incorporated into the auxetic structure; wherein the printing forms conformable, stretchable electrical interconnects, configured based on a design of the auxetic structure and a placement of the electrical conductors incorporated into the auxetic structure.

In an embodiment the method is defined wherein the printer arrangement is a 3D printer arrangement.

BRIEF DESCRIPTION OF THE DRAWINGS

FIGS. 1 and 2A-2B provide a visual comparison of a conventionally designed (honey-comb) material with an auxetic designed material for conformal attachment to a surface.

FIGS. 9A-9C illustrate various mass-spring arrangements.

DETAILED DESCRIPTION

The present disclosure describes structural designs which provide improved conformal form factors, density gradients and anchoring point options, as well as mechanical advantages that reduce potential resonance issues and ensure intimate contact between layers under strain.

In disclosed embodiments auxetic electrical interconnects and mass-spring interconnects designs are patterned by digital printing.

The auxetic electrical interconnects and mass-spring interconnects are used in combination or separately dependent on the particular implementations.

In certain embodiments the electrical interconnects serve both structural and electrical purposes, while in other embodiments the electrical conductor interconnects are provided in layers distinguishable from the structural parts of the auxetic structure.

Without being limiting, typical materials for electrical interconnects include printable metal inks (Ag, Au, Cu, Ni, etc.), conducting organics (PEDOT:PSS, carbon nanotubes, etc.), or composites of conductors and polymer binders, among others, and typical non-conducting conducting materials used in the auxetic structure include PDMS, among others.

Figure 2A:
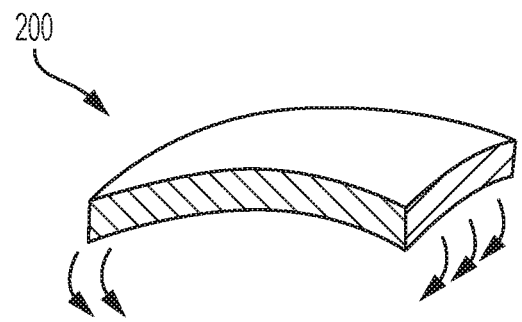
Figure 2B:
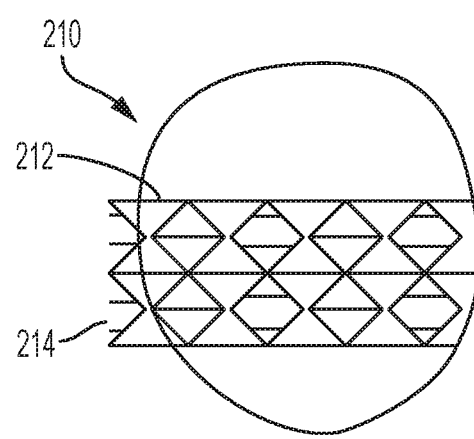

The ability to conform to curved surfaces is important for wearable applications. As shown in FIG. 1 previous stretchable interconnects have relied on out-of-plane buckling waves 100 or in-plane horseshoe patterns (not shown). However, these prior designs have various drawbacks including not being conformal on dome type shaped surfaces. On the other hand, patterning of the underlying substrate for auxetic interconnects includes the capability for conformal attachment, including such dome type shaped configurations such as auxetic pattern 200 of FIG. 2A. This is further shown in FIG. 2B where a dome element 210, has an Ag conductor 212 printed on stretchable PDMS scaffold 214.

Figure 3A:
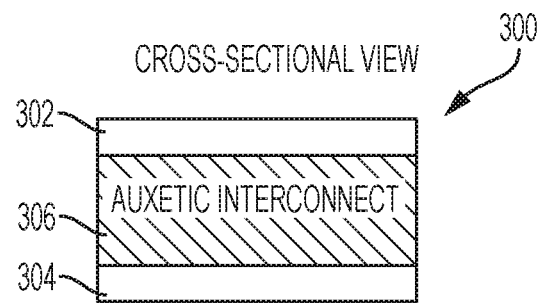
FIGS. 3A-3C show an expansion of an embedded auxetic interconnect layer to ensure contact between adjacent layers.
Figure 3B:
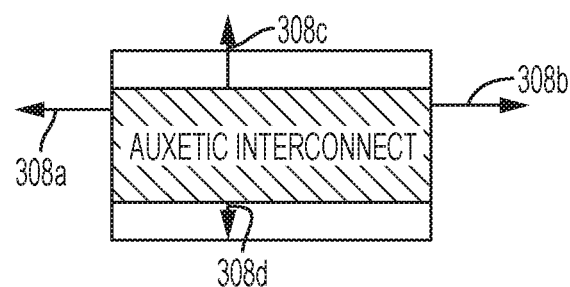

The auxetic design not only allows conformal placement but also the advantage of expansion in all directions upon stretching, thus ensuring good contact between layers. As show in FIGS. 3A-3C, the difference between a conventional interconnect layer and an auxetic interconnect is shown in more detail. In FIG. 3A, arrangement 300 includes an upper layer 302, a lower layer 304 and an auxetic interconnect layer 306 positioned therebetween. FIG. 3B shows the same cross-sectional view, but with arrows 308a-d, which are intended to explain that when the arrangement 300 is stretched in either the horizontal or vertical direction, the auxetic interconnect 306 conforms and reacts to maintain itself in contact with the upper layer 302 and the lower layer 304, such that there are no gaps which may reduce the desired contact between the layers.

Figure 3C:
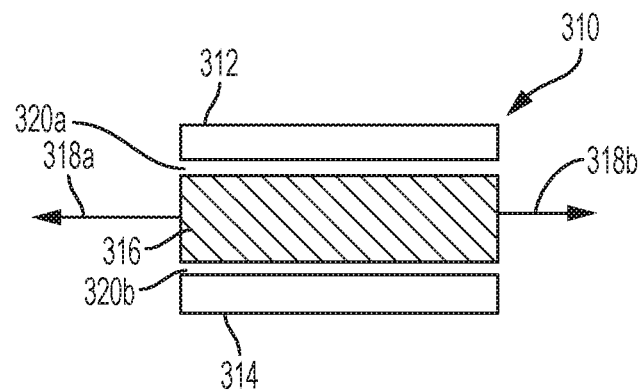

On the other hand, FIG. 3C shows a interconnect arrangement 310 which includes an upper layer 312, a lower layer 314, and an interconnect layer 316, configured of a non-auxetic material. As indicated by arrows 318a-b, when the structure 310 is stretched, for example, in the horizontal direction the conventional interconnect layer 316 does not maintain its contact with the upper layer 312 or the lower layer 314, creating gaps 320a-320b. This is, of course, detrimental, particularly when this interconnect arrangement is being used to create an electrical connection. Thus, expansion of an embedded auxetic interconnect layer such as shown in FIGS. 3A-3B acts to maintain contact between the adjacent layers even when being stretched or strained.

Figure 4A:
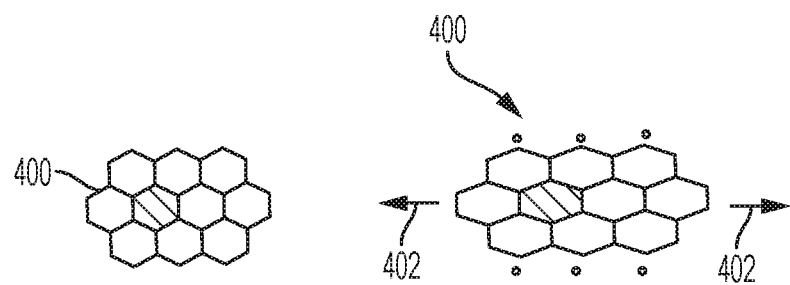
FIG. 4A depicts a conventional material and its form when stressed.
Figure 4B:
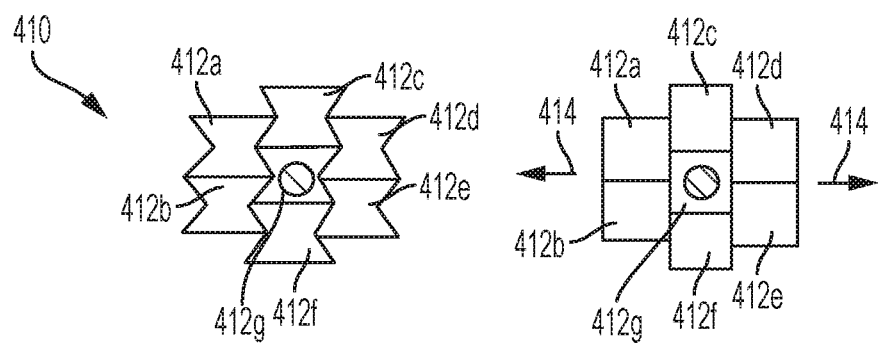
FIG. 4B depicts an auxetic material and its deformation when stressed.

To further explore this distinction attention is directed to FIG. 4A which depicts a non-auxetic material 400, such as in the form of a honey-comb structure. When stretched in the horizontal direction 402 it is shown that the material compresses. On the other hand with attention to FIG. 4B, illustrated is an auxetic design structure 410. As can be seen each cell 412a-412g, is in the form of a hinged or "bowtie" configuration. When strain or stress is put on this design 410, for example in the horizontal direction 414, the cells react by increasing in size, dependent upon the amount of stretching provided. In this example the cells 412a-412g are each equally sized, therefore the ratio of change would be expected to be approximately the same when a uniform amount of stress is applied. This feature of auxetic structures is obtained when the structure in question is provided with a negative Poisson's ratio, which may be defined to be the ratio of a lateral contractile strain compared to a longitudinal tensile strain for a material undergoing uniaxial tension in, for example, the longitudinal direction. The Poisson's ratio therefore determines the thickness a material changes when it is stretched lengthwise. The Poisson's ratio is positive for conventional type materials, whereas materials that are auxetic will have a negative Poisson's ratio.

Figure 5:
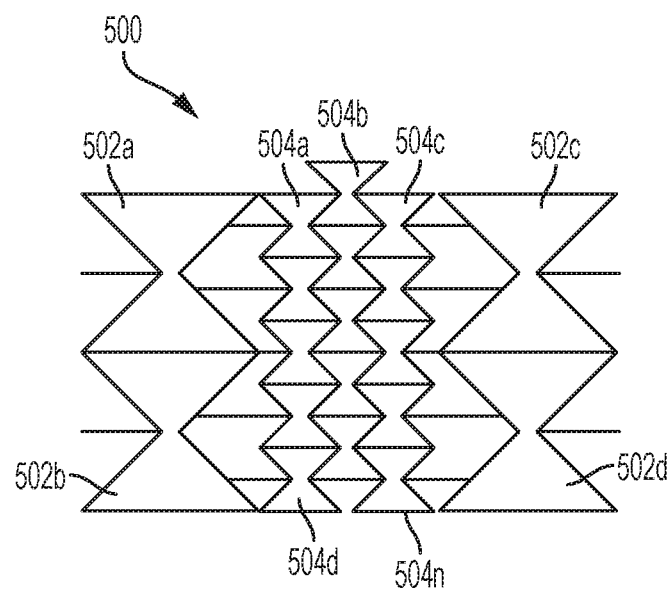
FIG. 5 is an auxetic designed material that uses varying cell size/densities.

As mentioned above the auxetic material 410 of FIG. 4B is designed such that each cell 412a-412g is substantially the same size. However, with attention to FIG. 5 auxetic material 500 illustrates an alternative configuration. Particularly the stretchability of an auxetic interconnect design can be adjusted by varying the unit cell size and density to accommodate areas that are subject to different degrees of strain. For example, as shown in material design or structure 500, cells 502a-502d are each essentially the same size and density within the system. However, a set of inner cells 504a-504n (not all numbered, for clarity) are sized differently from cells 502a-502d. Thus, for example, if there is an understanding that a certain location will have a greater degree of strain (e.g., where cells 504a-504n are located), then by adjusting the cell size and/or density of cells, a desired response profile can be achieved. For example, by making such changes a more consistent gradient stress may be obtained across the length of the auxetic designed structure or material 500. In certain embodiments, the cell size is in a range of the smallest cell size being five (5) times smaller than the largest cell size, and in other embodiments the range is the smallest cell size being three (3) times smaller than the largest cell size. Further, there may be more than two different cell sizes in a auxetic structure or material. It is of course understood that other designs and cell size arrangements may be used in employing the concepts described above, dependent on the particular implementation.

Figure 6:
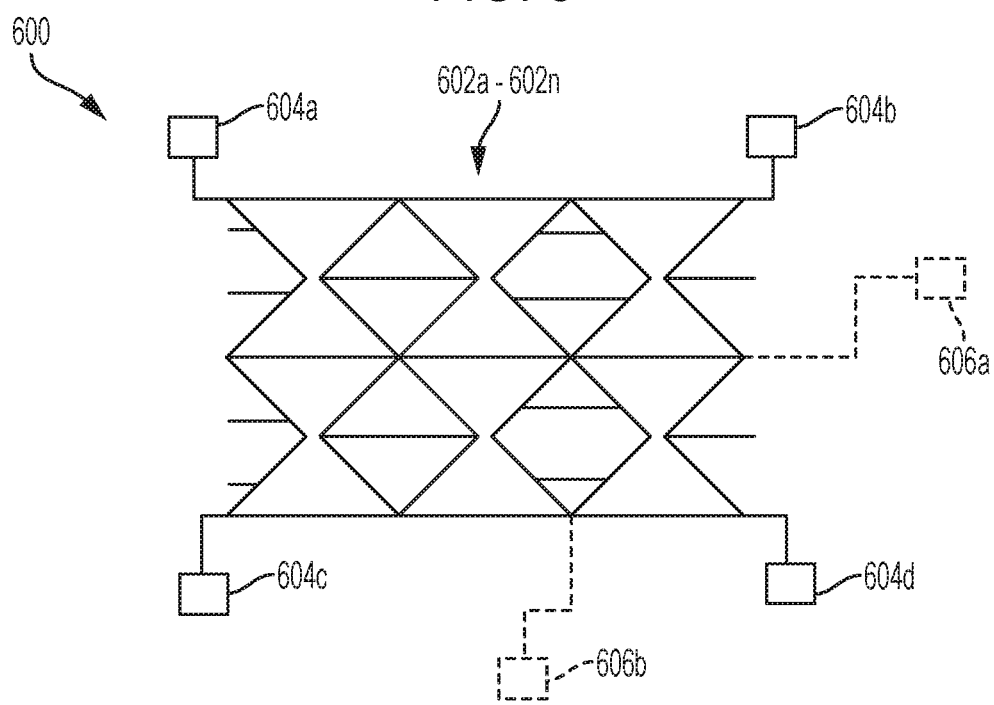
FIG. 6 is an auxetic designed material with anchor points.

Turning to FIG. 6, auxetic arrangement 600, includes cells 602a-602n, and also now shows selected anchor points 604a-604d, positioned at the four corners of arrangement 600. This provides one embodiment of how anchor points are used to control the stretch profile of auxetic designed structures or materials. FIG. 6 also illustrates with dotted anchor points 606*a*-606*b*, that anchor points do not need to be placed at the four corners (as done by points 604*a*-604*d*). But anchor points may be incorporated at various locations of the auxetic designed structure or material 600 to generate a distinct stretch profile for a particular implementation.

Anchor points are understood to provide a connection or insertion point for the auxetic designed structure or material into a surrounding material. This is achievable in one arrangement due to the lateral contraction in response to a compressive insertion force. Also, a resistance to removal to a locking or locking-in due to lateral expansion when placed under tensile removal force is also achieved. It is also understood that these anchor points that may be placed at multiple locations provide an uneven stretching, such as may be achieved by use of anchor points 606*a*, 606*b*.

Figure 7:
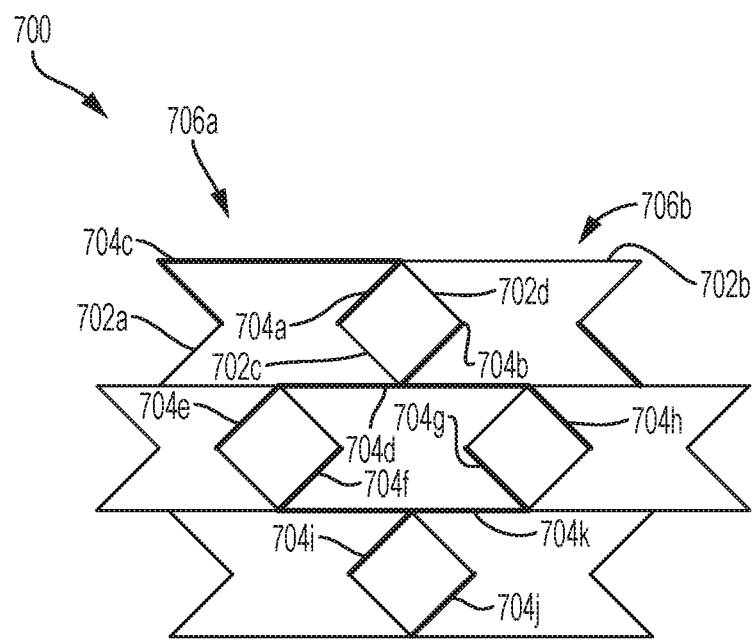
FIG. 7 shows a strain threshold sensor.

Turning to FIG. 7, illustrated is an embodiment of an auxetic material design or structure 700 which employs non-conductive elements (e.g., 702*a*, 704*d*, and other thin lines are understood to be non-conductive), and certain conductive traces (e.g., 704*a*-704*k*; other thick lines are understood to be conductive). The conductive traces 704*a*-704*k* may also be thought of as electrical interconnects, and are positioned to complete a conductive pathway upon stretching structure or material 700 to a specific threshold.

Figure 8:
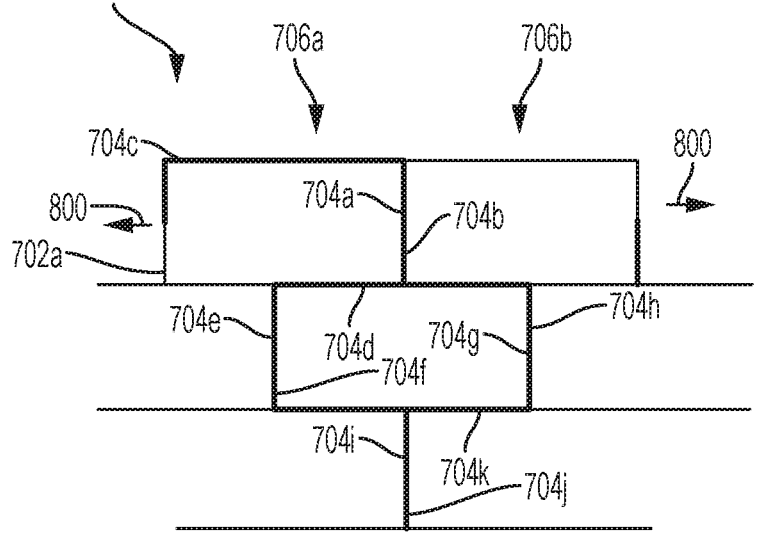
FIG. 8 shows FIG. 7 in a stressed state.

This is shown for example in FIG. 8, where the structure or material 700 has been stretched in the horizontal direction 800 which transforms material design or structure 700 into structure or design form 802. Particularly, as the stretching occurs, the auxetic nature of the structure 700, cause certain ones of the conductive traces to expand and come into contact with each other.

For example, cell 706*a* (see FIG. 7) incorporates conductive trace 704*a*, and cell 706*b* (see FIG. 7) incorporates conductive trace 704*b*. As these cells are stretched the nature of the auxetic structure causes these cells to expand. Due to this expansion conductive traces (704*a* and 704*b*) come into contact (see FIG. 8) forming a conductive path that did not previously exist between conductive trace 704*c* and 704*d*. The non-conductive traces 702*d* and 702*c* (not shown in FIG. 8 for clarity) are located on the outside of the conductor path formed by the connection between 704*a*-704*b*. The conductive traces 704*a* and 704*b* may be of a length so they at least partially overlap each other, or alternatively are sized such that their ends come into contact upon expansion. As can be seen in FIG. 8, the additional expansion in the other cells of the structure or material 700 provides further conductive pathways (e.g., 704*e* and 704*f*; 704*g* and 704*h*; 704*i* and 704*j*. In these connections the outer non-conductive traces associated with these pathways are not shown for clarity of the drawing).

In one embodiment, such a design may be used as a built-in strain resistive sensor or may provide the conductive paths for other uses, such as an electric switch.

The concepts of employing auxetic structures may also be applied in mass-spring auxetic designs. It is shown herein that asymmetric interconnects have advantages in reducing undesirable mechanical resonances. It is also understood that anchoring point selections for mass-spring designs also do not need to be symmetric, and using different anchoring points allows tailoring the stretching deformation to a desired shape.

When designing or modeling asymmetric mass-spring-damper designs, it is understood different anchoring points (e.g., squares) are used to stretch to different shapes that are optimized for cross-axis sensitivity, rotational stiffness, stress, and resonance frequency may be used.

In various implementations anchor points having at least one of symmetric and asymmetric designs can be used to adjust the stretch profile of the auxetic structure or material. The asymmetry is capable of occurring along a single axis or multiple axes, where the single axis is the x-axis and the multiple axes are in the x-, y-, and z-planes.

Figure 9C:
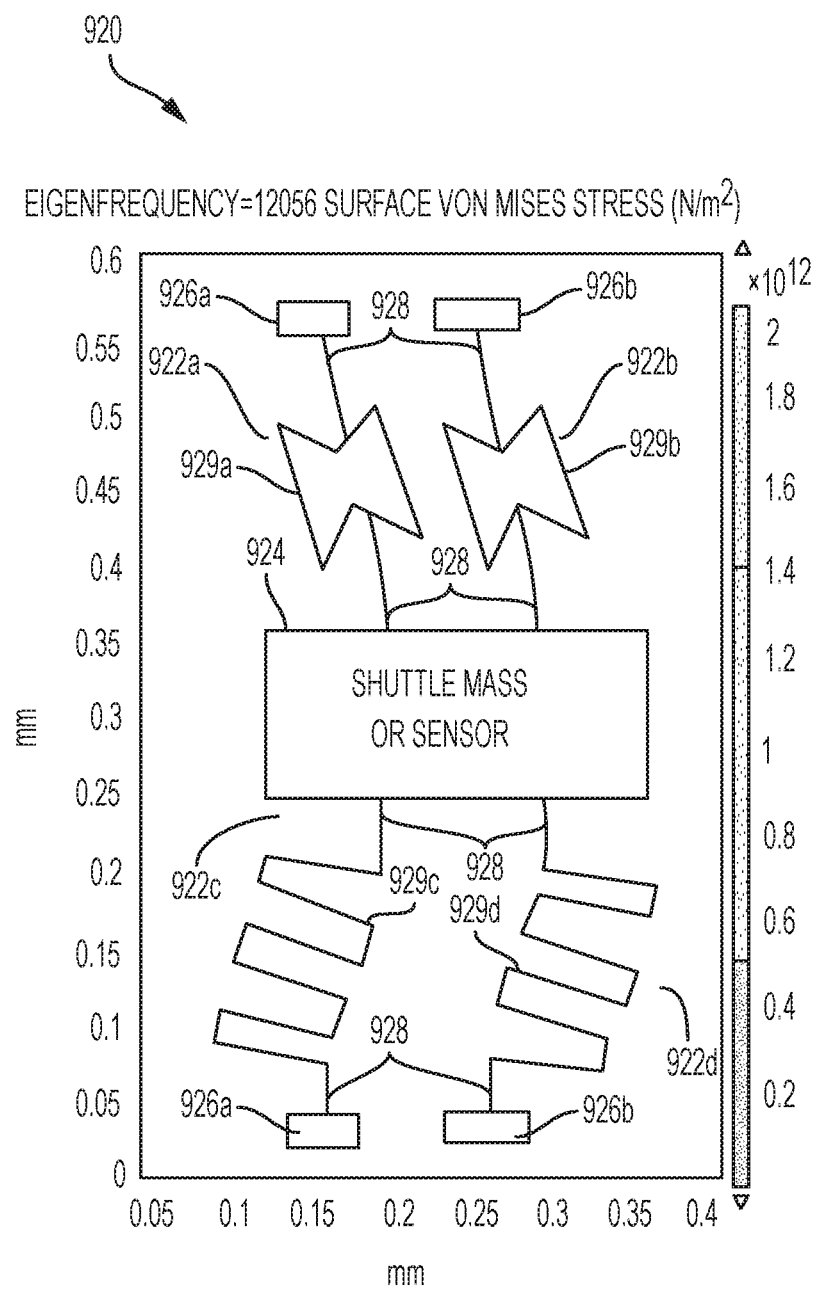

Both the auxetic and mass-spring interconnects are advantageous for systems using thick materials (>microns) like for thermoelectrics where high electrical conductivity is required, whereas using thin materials (below a micron) will mean cracks and delamination which impose limits on stretchability FIGS. 9A-9C illustrates Finite Element Modeling (FEM) of symmetric and asymmetric flexure designs. Mass-spring arrangement 900 of FIG. 9A contains straight flexures/interconnects 902*a*-902*d* where high stress concentration points 908 exist near the mass 904 and anchors 906*a*, 906*b*.

Turning to FIG. 9B illustrated is a mass-spring arrangement 910 which includes flexures/interconnects 912*a*-912*d*, configured as a symmetric auxetic arrangement 913, where high stress concentration points 918 exist near the mass 914 and anchors 916*a*, 916*b*.

Turning to FIG. 9C illustrated is a mass-spring arrangement 920 which includes flexures/interconnects 922*a*-922*d*, configured as an asymmetric arrangement, where high stress concentration points 928 exist near the mass 924 and anchors 926*a*, 926*b*. The asymmetric arrangement of flexures/interconnects includes auxetic systems 929*a* and 929*b*, and spring elements 929*c* and 929*d*. From investigation, it has been found the stresses at concentration points 908 are higher or equivalent to the stresses observed at concentration points 918 and 928, meaning the stresses in the new configurations 910 and 920 (FIGS. 9B and 9C) are equivalent or lower than the stresses of configuration 900 (FIG. 9A).

Using auxetic and serpentine structures (both symmetric and asymmetric in nature) of FIG. 9B and FIG. 9C, stress concentrations are reduced along the length of the design by 5-50% compared to the design in FIG. 9A. In plane bending mode (eigenfrequency) can be tuned depending on the application. The flexure designs in FIGS. 9B and 9C are more compliant, thus reducing the bending mode frequency.

It is also noted that while the anchors of FIGS. 9A-9C are located in an end location of the mass-spring arrangements, anchors maybe placed at alternative locations dependent upon the implementation and desired response.

Figure 10:
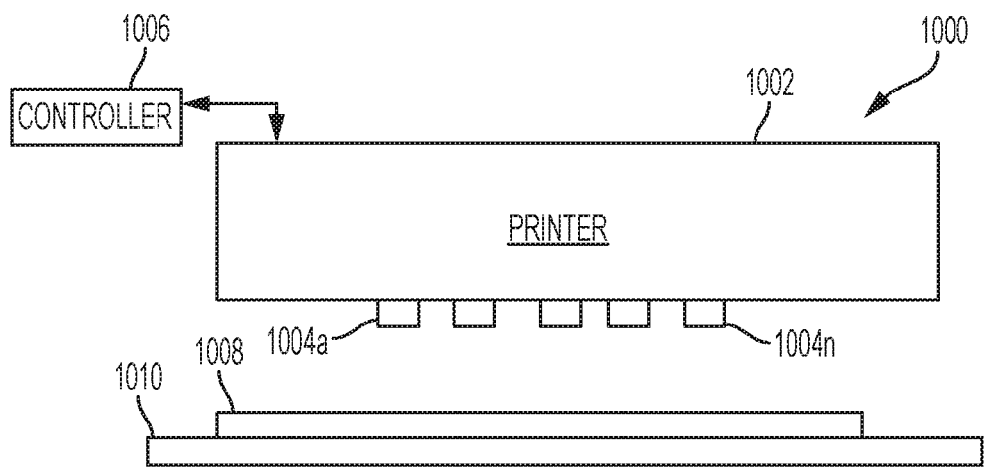
FIG. 10 illustrates a 3D printer system of the present application.

Turning to FIG. 10, illustrated is a three-dimensional (3D) printing system 1000 which includes a printer section 1002, having multiple print heads 1004*a*-1004*n*. Also shown is a controller 1006, which controls the operation of the printer 1002. The printer 1002 deposits appropriate material 1008 onto a surface or substrate 1010. The controller may be a computer, a dedicated computing device for the printer, a computing tablet or any other electronic device capable of providing instructions to the printer to perform the desired printing tasks. While shown separate from the printer 1002, the controller 1006 and printer 1002 may be integrated in a single structure. Still alternatively the controller 1006 may be geographically remote from the printer 1002, and communication maybe be via the internet, Wi-Fi or other wireless arrangement.

Thus FIG. 10 illustrates that the designs described above may be generated using 3D printing technology. In one embodiment, for example, with attention to FIG. 7, the design 700 which uses a flexible material for printing the non-conductive auxetic design portions may be configured where a second deposition lays down electrical conductive traces at specified locations for the design, such that when stretched under strain, desired circuit arrangements are formed. Alternatively, the electrical conductive traces themselves may form the portions of the auxetic design. In other words, a first deposition will print the non-electrical conductive components, and then a second deposition will fill in those spaces missing and necessary to have the electrical conductors. In this way, there is a single layer of the auxetic structure or material.

Figure 11A:
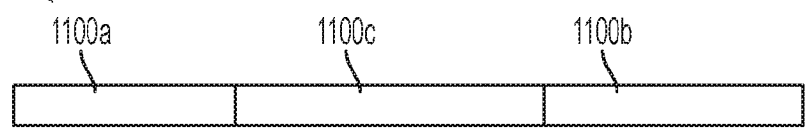
FIG. 11A illustrates an auxetic layer according to an operation of the 3D printer arrangement.
Figure 11B:
FIG. 11B illustrates an auxetic layer according to an operation of the 3D printer arrangement.
Figure 11C:
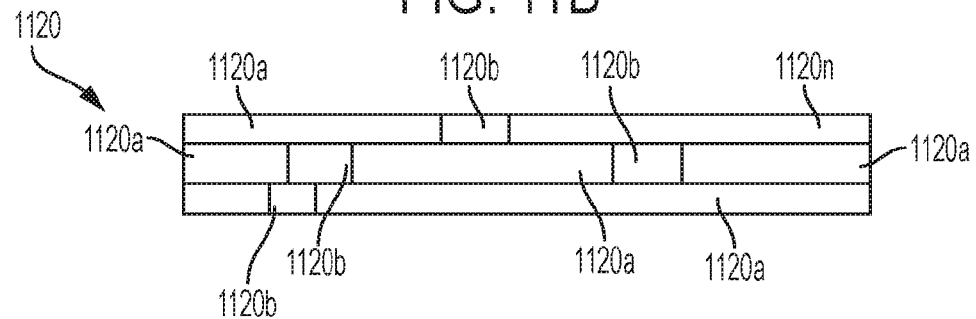
FIG. 11C illustrates a multilayered auxetic arrangement according to an operation of the 3D printer arrangement.

FIGS. 11A-11C more particularly illustrates various deposition possibilities in connection with the present application. FIG. 11A is a side view of a portion of a auxetic system or material according to the present application. Layer 1100 includes non-conductive auxetic portions 1100a and 1100b, and a conductive auxetic portion 1100c. Layer 1100 is formed via 3D printing by laying all material onto the same surface, either sequentially on be depositing all of one material (non-conductive or conductive) and then depositing the other material.

In FIG. 11B the 3D printing operation is used to form layer 1110. The printer first prints all of the auxetic structure with the non-conductive material 1110a, then the printer selectively prints onto areas of the non-conductive material 1110a, with an auxetic conductive material 1110b, such that the conductive material 1110b lays onto top of the non-conductive material 1110a.

In FIG. 11C the 3D printing operations are used to generate a multi-layered auxetic configuration 1120. In this operation various arrangements of the non-conductive auxetic material 1120a and conductive auxetic material 11120b are deposited to form an intended pattern under an intended stress range, such as when a wearable electronic device is being worn buy a human.

Thus the present application teaches that auxetic electrical interconnects and mass spring interconnects designs which are patterned by digital printing. The two groups of interconnect designs are in particular implementations used in combination while in other implementations are used separately. The electrical interconnects will serve both structural and/or electrical purposes, or electrical conductors are provided in the layers distinguishable from the structural parts of the auxetic design. It is understood, however, that the described structure types may be manufactured by other known printing or manufacturing processes.

It will be appreciated that variants of the above-disclosed and other features and functions, or alternatives thereof, may be combined into many other different systems or applications. Various presently unforeseen or unanticipated alternatives, modifications, variations or improvements therein may be subsequently made by those skilled in the art which are also intended to be encompassed by the following claims.

What is claimed is:

1. A conformable stretchable electrically conductive structure comprising:
    an auxetic structure; and
    a plurality of electrical conductors, at least some of the plurality of electrical conductors being incorporated as part of the auxetic structure;
    wherein conformable, stretchable electrical interconnects are configured in consideration of a design of the auxetic structure and a placement of the electrical conductors incorporated within the auxetic structure, wherein the auxetic structure includes multiple auxetic layers having selectively incorporated ones of the plurality of electrical conductors, wherein stretchable electrical interconnects are located with at least some of the multiple auxetic layers, and wherein electrical contact is maintained between the multiple auxetic layers.

2. The conformable stretchable electrically conductive structure according to claim 1 having a stretch gradient.

3. The conformable stretchable electrically conductive structure according to claim 2 wherein the stretch gradient is defined by unit cell sizes of the auxetic structure and density of the interconnects.

4. The conformable stretchable electrically conductive structure according to claim 1 further including anchoring points configured to anchor selected portions of the auxetic structure.

5. The conformable stretchable electrically conductive structure according to claim 1 further including anchoring points which adjust a stretch profile.

6. The conformable stretchable electrically conductive structure according to claim 1 further including a first set of anchoring points and a second set of anchoring points, wherein the first set of anchoring points provide a first stretch profile of the auxetic structure, and the second set of anchoring points provide a second stretch profile of the auxetic structure different from the first stretch profile of the auxetic structure.

7. The conformable stretchable electrically conductive structure according to claim 1 further including incorporating at least a sensor or an actuator, for built in sensing or actuation.

8. The conformable stretchable electrically conductive structure of claim 1, wherein the auxetic structure has a negative Poisson's ratio.

9. A conformable stretchable electrically conductive structure comprising:
    an auxetic structure;
    a plurality of electrical conductors, at least some of the plurality of electrical conductors being incorporated as part of the auxetic structure;
    an asymmetric mass-spring-damper structure incorporated with the auxetic structure and the electrical conductors, to form conformable, stretchable electrical interconnects; and
    anchor points having one of symmetric and asymmetric designs to adjust stretch profile,
    wherein the conformable, stretchable electrical interconnects are configured inconsideration of a design of the auxetic structure and a placement of the electrical conductors incorporated within the auxetic structure, and
    wherein the asymmetric mass-spring-damper structure is used to strain-relief and dampen selected mechanical resonance based on human body movements.

10. The conformable stretchable electrically conductive structure according to claim 9 wherein asymmetry is capable of occurring along a single axis or multiple axes.

11. The conformable stretchable electrically conductive structure according to claim 10 wherein the single axis is the x-axis and the multiple axes are x-, y-, and z-plane.

12. The conformable stretchable electrically conductive structure of claim 9, wherein the auxetic structure has a negative Poisson's ratio.

* * * * *